US 11,226,288 B2

(12) United States Patent
Arnoult

(10) Patent No.: US 11,226,288 B2
(45) Date of Patent: Jan. 18, 2022

(54) DEVICE FOR MEASURING A FLUX OF MATTER BY ABSORPTION OF LIGHT, AND CORRESPONDING MEASURING METHOD

(71) Applicant: CENTRE NATIONAL DE LA RECHERCHE SCIENTIFIQUE, Paris (FR)

(72) Inventor: Alexandre Arnoult, Auzeville-Tolosane (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 17/261,357

(22) PCT Filed: Jul. 8, 2019

(86) PCT No.: PCT/EP2019/068286
§ 371 (c)(1),
(2) Date: Jan. 19, 2021

(87) PCT Pub. No.: WO2020/016043
PCT Pub. Date: Jan. 23, 2020

(65) Prior Publication Data
US 2021/0278342 A1    Sep. 9, 2021

(30) Foreign Application Priority Data

Jul. 20, 2018   (FR) ...................... 1856743

(51) Int. Cl.
*G01N 21/00*     (2006.01)
*G01N 21/59*     (2006.01)
(Continued)

(52) U.S. Cl.
CPC ................ *G01N 21/59* (2013.01); *G01J 3/42* (2013.01); *G01N 21/3103* (2013.01);
(Continued)

(58) Field of Classification Search
CPC ..... G01J 1/1626; G01N 21/534; G01N 21/59; G01N 21/27; G01N 21/8507
(Continued)

(56) References Cited

U.S. PATENT DOCUMENTS

2012/0117793 A1*   5/2012   Beurthey ............. G02B 6/3816
                                                    29/700
2012/0161022 A1    6/2012   Thomson et al.

FOREIGN PATENT DOCUMENTS

WO        2018078384 A1     5/2018

OTHER PUBLICATIONS

English translation of the Written Opinion of the International Searching Authority dated Aug. 9, 2019 for corresponding International Application No. PCT/EP2019/068286, filed Jul. 8, 2019.
(Continued)

*Primary Examiner* — Md M Rahman
(74) *Attorney, Agent, or Firm* — David D. Brush; Westman, Champlin & Koehler, P.A.

(57) ABSTRACT

A device for measuring a matter flux, including: at least one first light source to emit a first light beam having a measurement wavelength corresponding to the absorption wavelength of an element of interest of the matter flux; an optical connector; and a light sensor to receive, via the optical connector: an attenuated beam resulting from a transmission of the first light beam through the matter flux; and a non-attenuated beam resulting from a transmission of the first light beam without passing through the matter flux. The light sensor is one-dimensional and the optical connector is positioned relative to the light sensor so that the center of the optical connector is aligned with the center of the light sensor, the non-attenuated beam is spectrally directed
(Continued)

towards a first part of the light sensor and the attenuated beam is spectrally directed towards a second part of the light sensor.

8 Claims, 2 Drawing Sheets

(51) Int. Cl.
  *G01J 3/42*  (2006.01)
  *G01N 21/31*  (2006.01)
  *G01J 3/02*  (2006.01)
(52) U.S. Cl.
  CPC .......... *G01N 21/314* (2013.01); *G01J 3/0218* (2013.01); *G01J 3/0297* (2013.01)
(58) Field of Classification Search
  USPC ........................................................ 356/435
  See application file for complete search history.

(56) References Cited

OTHER PUBLICATIONS

International Search Report dated Aug. 9, 2019 for corresponding International Application No. PCT/EP2019/068286, filed Jul. 8, 2019.
Written Opinion of the International Searching Authority dated Aug. 9, 2019 for corresponding International Application No. PCT/EP2019/068286, filed Jul. 8, 2019.
Y. Du et al., "Self-corrected sensors based on atomic absorption spectroscopy for atom flux measurements in molecular beam epitaxy", Applied Physics Letters, US, vol. 104, No. 16, Apr. 21, 2014 (Apr. 21, 2014), p. 163110, XP055549072.

* cited by examiner

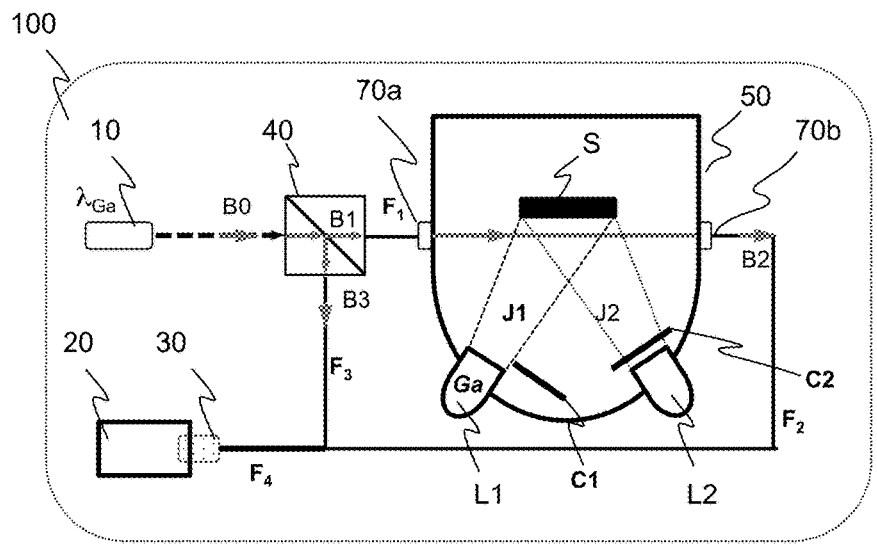
Figure 1
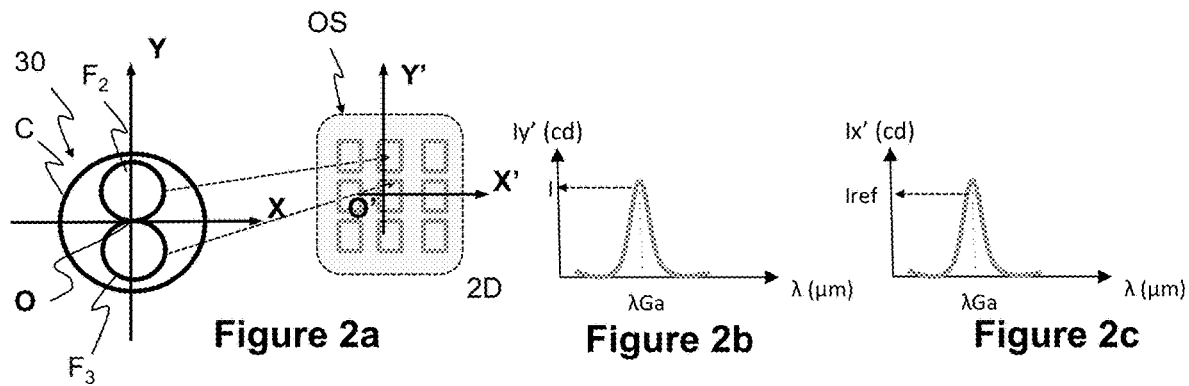
Figure 2a  Figure 2b  Figure 2c
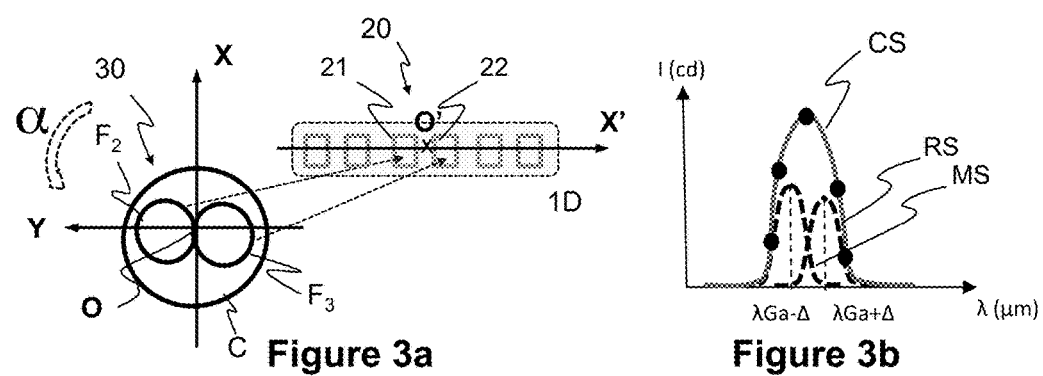
Figure 3a  Figure 3b

DEVICE FOR MEASURING A FLUX OF MATTER BY ABSORPTION OF LIGHT, AND CORRESPONDING MEASURING METHOD

CROSS-REFERENCE TO RELATED APPLICATIONS

This Application is a Section 371 National Stage Application of International Application No. PCT/EP2019/068286, filed Jul. 8, 2019, which is incorporated by reference in its entirety and published as WO 2020/016043 A1 on Jan. 23, 2020, not in English.

1. FIELD OF THE INVENTION

The field of the invention is that of the measurement and control of a matter flux, such as an atom flux or a molecular flux for example.

More specifically, the invention relates to a device for measuring a matter flux through the absorption of light by this matter flux.

The invention applies especially, but not exclusively, to the technique of molecular beam epitaxy (or MBE) for determining the amplitude of the matter flux generated in a deposition chamber, in order to control the deposition rate or speed.

More generally, the invention can be applied in all cases where it is possible to carry out a spectral measurement by light absorption by a matter flux.

2. TECHNOLOGICAL BACKGROUND

Here below in this document, we shall strive more particularly to describe the problems and issues that exist in the field of molecular beam epitaxy and were faced by the inventor. The invention is of course not limited to this particular field of application but is of interest for any technique for the measurement of matter fluxes having to face proximate or similar problems.

Molecular beam epitaxy (MBE) is a technique that consists in producing one or more matter fluxes (atom fluxes and/or molecule fluxes) directed towards a pre-selected substrate, such as a gallium arsenide wafer for example, to achieve an epitaxial growth of thin layers based on one or more chemical elements of interest (typically aluminum, gallium, arsenic, etc.). This technique enables a set of thin layers to be grown in a controlled manner on the substrate, typically at a rate of one atom layer per second.

A molecular beam epitaxy frame generally comprises a vacuum deposition chamber in which atom fluxes are emitted from one or more atom flux sources (typically effusion cells), each flux source being directed towards the substrate so that the emitted atom fluxes condense uniformly on it.

In order to control the growth of the thin films on the substrate, the atom flux evaporating from the effusion cells needs to be controlled. To this end the epitaxy frame has, for each effusion cell, a mechanical shutter that can take two positions: a shut position in which it shuts off the flux of atoms coming from the effusion cell and an open position in which it lets through the flux of atoms coming from the effusion cell.

However, the opening of the shutters transiently and uncontrolledly creates an excess matter flux of unknown amplitude. This transient phenomenon is a cause of fluctuation in the matter flux during deposition.

In academic research, spectroscopy currently offers the possibility of performing non-destructive and real-time measurements to estimate the thickness of the thin layers deposited on the substrate, and therefore to control the growth of the stack of thin layers. made. These non-destructive measurements are based on a spectroscopic analysis of the absorption of light by the atoms present in the matter flux evaporated in the vacuum chamber during the deposition. This analysis is based on the Beer-Lambert law which establishes a link of proportionality between the rate of absorption of a light beam of known wavelength passing through the matter flux, the density of atoms of this matter flux, as well as the thickness of the matter flux crossed. Since this last-named quantity being relatively stable over time, the absorption rate is often considered to be based mainly on the density of material contained in the flux.

A known solution for measuring a matter flux consists in using a device for measurement by absorption spectroscopy (also called a spectrophotometer) that relies on a transmission assembly and the generation of a measurement light beam, the wavelength of which corresponds to the absorption wavelength of the element of interest. Generally, the wavelength of the measurement beam is chosen to match the wavelength at which the absorption of light by the matter is the maximum. To this end, the device comprises, for an element of interest in the matter flux to be measured (for example gallium), a hollow cathode lamp based on said element. The measuring device further comprises a one-dimensional or 1D light sensor (a sensor having one measurement dimension) sensitive to a predetermined spectral band and suitable for spectral analysis. The hollow cathode lamp, the epitaxy frame and the light sensor are arranged to allow analysis by transmission of light through the matter flux to be observed.

However, the light intensity emitted by a hollow cathode lamp fluctuates significantly over time (deposition by epitaxy can last several hours), making the spectral measurements imprecise. This phenomenon is another cause of instability of the measurements during the deposition.

In order to take account of this instability of the light intensity of hollow cathode lamps, one solution could be to have a two-dimensional or 2D sensor (a sensor having two dimensions pf measurement). This solution would include the generation of a double beam: a first beam—called a measurement beam—that would pass through the matter flux contained in the deposition chamber and a second beam—called a reference beam—that would not pass through the matter flux and would arrive directly on the light sensor. Each of the measurement and reference beams would then be detected using the two-dimensional sensor so as to independently measure the light intensity of each beam and produce the transmission spectrum corresponding to the matter flux analyzed.

This solution is relatively costly to implement since it would require the use of a two-dimensional sensor in the measuring device (spectrophotometer), and therefore the use of a much more costly spectrophotometer.

One way to do away with a costly two-dimensional sensor could consist in equipping the measuring device with two one-dimensional light sensors, the first sensor being dedicated to measuring the light intensity of the measurement beam, the second sensor being dedicated to measuring the light intensity of the reference beam. The matter flux could then be measured independently of the fluctuations of intensity of the hollow cathode lamps with the received measurement and reference beams being taken into account respectively by the first and second sensors. In order to take account of any measurement drifts linked to the temperature variation of the two sensors, an additional reference light source would be necessary in order to continuously normalize the sensitivity levels of the two light sensors.

But here again, such a configuration would be particularly costly to implement since it would require the use of two light sensors (for example two spectrophotometers).

It would therefore appear particularly advantageous to be able to have available a technique for measuring a matter flux that would integrate a single one-dimensional sensor while enabling a measurement of a measurement signal and of a reference signal.

3. SUMMARY OF THE INVENTION

One particular embodiment of the invention provides a device for measuring a matter flux, comprising:
- at least one first light source light source configured to emit a first light beam having a measurement wavelength corresponding to the absorption wavelength of an element of interest of said matter flux;
- an optical connector;
- a light sensor configured to receive, via said optical connector:
  - an attenuated beam resulting from a transmission of the first light beam through said matter flux;
  - a non-attenuated beam resulting from a transmission of the first light beam without passing through said matter flux.

The device is such that the light sensor is a one-dimensional light sensor, and the optical connector is positioned relative to the one-dimensional light sensor such that the center of the optical connector is aligned with the center of the one-dimensional light sensor, such that the non-attenuated beam is spectrally directed to a first part of the one-dimensional light sensor and such that the attenuated beam is spectrally directed to a second part of the one-dimensional light sensor.

Thus, this particular embodiment of the invention offers a simple and innovative solution consisting in deliberately creating a misalignment of the optical connector receiving the attenuated and non-attenuated light beams, relative to the input of a one-dimensional light sensor, so as to enable the simultaneous measurement of these light beams with a single measurement dimension.

Thus, this solution offers the possibility of using a low-cost one-dimensional sensor to carry out a measurement of the matter flux that is insensitive to the instability of the light source.

According to one particular aspect of the invention, the one-dimensional light sensor and the optical connector are defined respectively along a longitudinal axis and an alignment axis, so that the longitudinal axis of the sensor and the alignment axis of the connector form an angle strictly greater than 0° and strictly smaller than 180°.

More precisely, the angle formed between the alignment axis and the longitudinal axis of the sensor ranges from 85° to 95°. Thus, this angle remains close enough to 90° to ensure a sufficient spectral shift of the spectral representations resulting from the attenuated and non-attenuated beams.

Thus, by having such an arrangement, the inventor has observed that the spectral signal obtained on one measurement dimension corresponds to a combination of an attenuated signal (resulting from the attenuated beam) and a reference signal (resulting from the non-attenuated beam), each shifted spectrally on either side of the measurement wavelength. This is all the more ingenious as, for those skilled in the art, the fact of misaligning the optical connector relative to the sensor should have decreased the light intensity detected and therefore degraded the measurement signal, to a point where such an approach would not have been adopted by him or her. It was in fact been observed that, despite a deterioration of the optical signal, it is possible to measure the matter flux in adequate conditions while remaining insensitive to fluctuations of the light source.

According to another particular aspect of the invention, the one-dimensional light sensor is positioned horizontally, and the first part is a right-hand part of the one-dimensional light sensor and the second part is a left-hand part of the one-dimensional light sensor.

The right-hand and left-hand parts of the sensor can be likened to first and second photosites or to first and second groupings of photosites of the sensor.

The first and second photosites or groupings of photosites may or may not be adjacent.

According to one particular aspect of the invention, the device comprises a beam splitter element configured to split the first light beam on the basis of a light intensity splitting ratio defined by a/b, with a from 50 to 70 and b from 50 to 30.

According to one particular aspect of the invention, said at least one first light source is a hollow cathode lamp, said device comprising a second light source configured to emit a second spectrally stable light beam and having a wavelength different from said absorption wavelength, said second beam being emitted towards the one-dimensional light sensor in taking an optical path taken by the attenuated beam.

The use of a light-emitting diode for example as a second light source makes it possible to take account of the measurement drifts linked to the variation of the optical measurement path.

According to one particular aspect of the invention, the attenuated and non-attenuated beams received by the one-dimensional light sensor take the form of a combined spectral signal representative of a combination of a measurement spectral signal corresponding to the attenuated beam received and a reference spectral signal corresponding to the non-attenuated beam received.

According to one particular aspect of the invention, the device comprises an optically reflecting means configured to reflect the attenuated beam towards said matter flux to produce a doubly attenuated beam resulting from a double transmission of the first light beam through said matter flux, the one-dimensional light sensor being configured to receive and direct said doubly attenuated beam towards the second part of the one-dimensional light sensor.

Such a configuration makes it possible to increase the precision of the matter flux measurements.

In another embodiment of the invention, a method is provided for measuring a matter flux by means of the above-mentioned measuring device (according to any one of its various embodiments), the method comprising a step for measuring the matter flux as a function of the attenuated beam received by the first part of the one-dimensional light sensor and of the non-attenuated beam received by the second part of the one-dimensional light sensor.

Another embodiment of the invention proposes a computer program product comprising program code instructions for implementing the above-mentioned method (in any one of its different embodiments), when said program is executed on a computer.

Another embodiment of the invention proposes a non-transient, computer-readable storage medium, storing a computer program comprising a set of instructions executable by a computer to implement the above-mentioned method (in any of its different embodiments).

4. LIST OF FIGURES

Other features and advantages of the invention shall appear from the following description, given by way of an indicative and non-restrictive example, and from the appended drawings, in which:

FIG. 1 is a block diagram of a measuring device according to a first particular embodiment of the invention;

FIGS. 2a-2c schematically represent the principle of measurement by absorption of a matter flux based on the use of a two-dimensional light sensor;

FIGS. 3a and 3b schematically represent the principle of measurement by absorption of a matter flux relying on the use of a one-dimensional light sensor;

5. DETAILED DESCRIPTION

Figure 4:
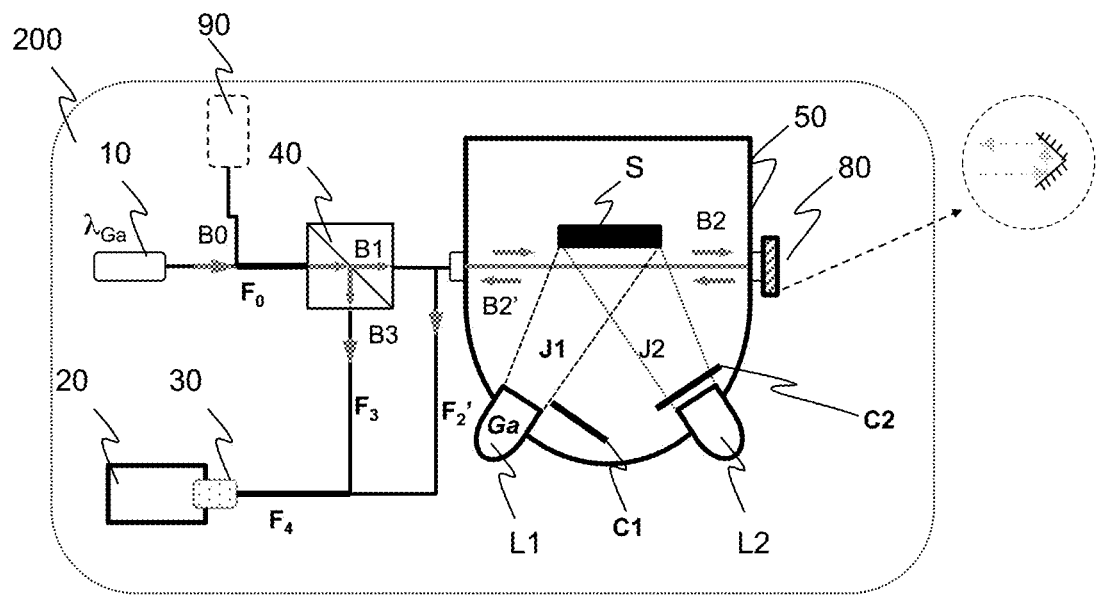
FIG. 4 is a block diagram of a measuring device according to a second particular embodiment of the invention.

In all the figures of this document, identical elements are designated by the same numerical reference.

The principle of the invention is based on an ingenious approach consisting in artificially creating a misalignment of the optical connector receiving the attenuated and non-attenuated light beams, relatively to the input of the one-dimensional light sensor, in order to enable a simultaneous measurement of a measurement signal and a reference signal on a sensor using only one dimension of measurement.

Referring to FIG. 1, a simplified diagram is presented of a measuring device 100 according to a first particular embodiment of the invention. In this particular embodiment, the measuring device 100 enables the real-time delivery, by atomic absorption spectrophotometry, of a spectral representation of a matter flux that is sprayed in the direction of a substrate S according to the technique of molecular beam epitaxy. The chemical element of interest taken here by way of example is gallium (Ga). Naturally, other chemical elements of interest or combinations of chemical elements of interest can be used without departing from the framework of the invention.

The measuring device 100 comprises a light source 10, a beam splitter cube 40, a molecular beam epitaxy frame 50, a one-dimensional light sensor 20, an optical connector 30, and a processing unit (not shown in FIG.). As illustrated in the figure, the elements of the device 100 are disposed to enable analysis by transmission of light through the matter flux to be analyzed.

The epitaxy frame 50 comprises a vacuum deposition chamber equipped with two sources of atomic fluxes: a first source L1, of an effusion cell type, used for the effusion of a beam of gallium atoms (J1) oriented towards the substrate S and a second source L2, of an effusion cell type, used for the effusion of a beam of arsenic atoms (J2) oriented towards the substrate S. The flux source L1 is associated with a mechanical shutter C1 and the flux source L2 is associated with a mechanical shutter C2. To avoid burdening the figure, only two atomic flux sources are represented therein by way of a purely illustrative example. It should be noted that the number and the arrangement of the flux sources are not limited to the present example and can be adapted on a case-by-case basis, depending especially on the nature and type of deposit made. In the remainder of the description, in order make it easier to understand the invention, it is assumed that only the source of the flux of gallium (L1) atoms is activated during the spectral measurement. Naturally, the general principle of the invention applies equally well to a single-source deposition chamber as to a multiple-source deposition chamber.

The principle of measurement implemented by the device 100 is based on the generation of a double beam: a first measurement beam (or attenuated beam) that passes through the matter flux J1 and a second reference beam (or non-attenuated beam) that does not pass through the matter flux J1 and arrives directly on the one-dimensional light sensor 20.

The light source 10 is chosen so that it emits a wavelength adapted to the flux of atoms to be measured, i.e., it gives rise to an absorption of photons at this wavelength by the flux of atoms J1. In the present example, the light source is therefore a gallium-based hollow cathode lamp. This lamp has the advantage of emitting a light beam having a characteristic wavelength corresponding to the absorption wavelength of gallium atoms (Ga=417 nm).

The light sensor 20 according to the invention is a one-dimensional light sensor, such as for example a CCD array type spectrometer, sensitive to the UV wavelengths range (typically between 380 and 457 nm). It is configured to detect the intensity of the UV light that it receives via the optical connector 30 and converts it into an electrical signal intended for the processing unit. The processing unit is electrically connected to the light sensor 20 on the one hand and to the light source 10 on the other hand, as well as to the deposition chamber in order to drive the flux sources L1 and L2.

In general, the term "one-dimensional sensor" in the context of the present invention is understood to mean a sensor having one measurement dimension or a two-dimensional sensor using only one measurement dimension.

The object of the measuring device 100 is to measure the amplitude of the matter flux J1 emitted by the flux source L1 in order to control the rate of deposition of the gallium atoms on the substrate S. To this end, the light source 10 emits an incident light beam B0 of wavelength $\lambda_{Ga}$ towards the beam splitter cube 40. The beam splitter cube 40 is used here to split the incident light beam on the basis of a light intensity splitting ratio of 70/30. Thus, the splitter cube 40 is arranged so as to divide the incident light beam B0 into a first transmitted beam B1, of wavelength $\lambda_{Ga}$, and a second reflected beam B2, of the same wavelength $\lambda_{Ga}$, on the basis of the above splitting ratio (70% for beam B1 and 30% for beam B2). The transmitted beam B1 is sent to the deposition chamber of the epitaxy frame 50 by means of an optical guide, such as a multimode optical fiber $F_1$ in order to be conveyed to the entrance window of the deposition chamber. An optical focusing and/or collimation system 70a is coupled to the optical fiber $F_1$ on the one hand and to the wall of the deposition chamber on the other hand, so that the transmitted beam B1 can be correctly injected into the deposition chamber so that it is absorbed by the atom flux J1 as effectively as possible. The light beam B1 then passes through the atom flux J1 up to the exit window of the deposition chamber. A part of the light from the light beam is then absorbed according to the phenomenon of atomic absorption described above, the other part being transmitted. An optical defocusing or de-collimation system 70b is also coupled, on the one hand, to the exit window and, on the other hand, to the optical fiber $F_2$ so that the light beam B2 exiting the deposition chamber can be correctly injected into the optical fiber $F_2$ before reaching the one-dimensional light sensor 20. As for the reflected beam B3 exiting the splitter cube 40, it is directly injected into another multimode optical fiber $F_3$ without passing through the epitaxy frame 50.

The light beam B2, coming from the epitaxy frame 50, is hereinafter called an "attenuated beam" or "measurement beam" because it results from transmission of the incident light beam B0 through the atom flux J1.

The light beam B3 coming from the splitter cube 40 is hereinafter called a "non-attenuated beam" or "reference beam", because it results from the transmission of the incident light beam B0 without passing through the atom flux J1.

The optical fibers $F_2$ and $F_3$ are grouped together in a multi-core optical guide $F_4$. This optical guide $F_4$ thus transports the attenuated beam B2 and the non-attenuated beam B3 to the optical connector 30.

The optical connector 30 (for example an SMA type connector) is an optical fiber end connector disposed at the free extremity of the optical guide $F_4$. Its function is to align and mechanically couple the optical fibers to the light sensor 20 so that the light from the optical fibers $F_2$ and $F_3$ can be transmitted to the light sensor 20 through its entrance slit. Such a connector is also sometimes called a ferrule tip or optical coupler.

Referring to FIG. 2a, an example of configuration between an optical connector 30 and a two-dimensional light sensor OS such as exists in the prior art is now presented. The optical connector 30, seen in section, is shown here in an (O; X, Y) reference system. The optical connector 30 comprises a body C with a circular section and a center O that extends along the transverse axes X and Y. The body C has a diameter typically between 2 and 10 mm and comprises, for each fiber of the optical guide $F_4$, an aperture for receiving said fiber at its extremity.

In this configuration, the optical fiber $F_2$ (which carries the measurement beam) is superimposed on the optical fiber $F_3$ (which carries the reference beam) along the transverse axis Y of the body C (this is then called a vertical alignment). In other words, the optical fibers $F_2$ and $F_3$ are aligned at the input of the light sensor OS along the transverse axis Y of the body C, called the "fiber alignment axis". Thus, the term "aligning the optical fibers" is understood to mean the fact of arranging the optical connector so that the center O of the optical connector is aligned with the center O' of the light sensor OS and so that the transverse axis Y of the optical fibers $F_2$ and $F_3$ coincides with the longitudinal axis Y' of the light sensor (this axis Y' in fact corresponds to the longitudinal axis of the entrance slit of the sensor). Now, in order to simultaneously visualize the spectral measurement signal (FIG. 2b) and the reference spectral signal (FIG. 2c), it is necessary to use a two-dimensional light sensor OS, i.e., a sensor having two measurement dimensions. This is shown in FIG. 2a in a two-dimensional (O'; X'; Y') reference system. Indeed, when the optical fibers $F_2$ and $F_3$ are vertically aligned at the input of the light sensor OS (the alignment axis Y of the connector then coincides with the axis Y' of the sensor), the resulting image obtained by the two-dimensional sensor OS is spatially resolved and exhibits two distinct spectral representations, as shown in FIGS. 2b and 2c. The symbol "/" represents the light intensity of the measurement beam detected on a first measurement dimension (corresponding to the axis Y' of the sensor OS, "/y'" representing the light intensity detected along said axis Y') and the symbol "Iref" representing the light intensity of the reference beam detected on a second measurement dimension (corresponding to the axis X' of the sensor OS, "Ic'" representing the light intensity detected along said axis X'). As can be seen, to obtain the spectral representation of measurement beam B2 and reference beam B3, the sensor OS simultaneously and independently detects the light intensity of the reference beam on the axis OX' (first measurement dimension) and furthermore the light intensity of the measurement beam on the axis OY' (second measurement dimension). As discussed above in relation to the prior art, this solution has the drawback of being costly to implement, and the use of a one-dimensional sensor could present a particularly advantageous solution, especially in. academic research.

FIG. 3a schematically represents an example of a configuration of the optical connector 30 and of the one-dimensional sensor 20 according to the invention.

The one-dimensional light sensor 20 is shown here in a one-dimensional (O'; X') reference system. In this configuration, the sensor is said to be positioned horizontally.

The idea is to position the optical connector 30 relative to the one-dimensional light sensor 20 so that the center O of the optical connector 30 is aligned with the center O' of the one-dimensional sensor 20, and such that the measurement beam B2 of the fiber $F_2$ is spectrally directed towards a first part 21 (called a "left-hand part") of the one-dimensional sensor 20 and such that the reference beam B3 of the fiber $F_3$ is spectrally directed towards a second part 22 (called a "right-hand part") of the one-dimensional sensor 20.

More precisely, in this particular example, the one-dimensional light sensor 20 and the optical connector 30 are disposed relative to each other such that the longitudinal axis X' of the one-dimensional sensor 20 and the transverse axis Y of the connector optics 30 form an angle α substantially equal to 90°. In this way, the alignment axis Y (i.e., the axis passing through the optical fibers $F_2$ and $F_3$) coincides with the longitudinal axis X' of the one-dimensional sensor 20, in order to deliberately generate a wavelength shift of both beams on the reception side. This wavelength shift is denoted by Δ on the transmission spectrum illustrated in FIG. 3b. Thus, when the optical fibers $F_2$ and $F_3$ are horizontally aligned at the input of the one-dimensional light sensor 20 (the alignment axis Y then coincides with the axis X' of the sensor), the resulting image obtained by the sensor presents a single distinct spectral representation (CS).

This configuration is particularly advantageous since it offers the possibility of using a light sensor with one measurement dimension, which has the advantage of being less costly than a two-dimensional light sensor, while allowing simultaneous measurement of the measurement beam. B2 and the reference beam B3.

This is one particular embodiment in which the wavelength shift of the beams is the maximum. However, it is quite possible to envisage other configurations that meet the following general principle: the light sensor 20 is disposed relative to the optical connector 30 such that the longitudinal axis X' of the sensor 20 and the alignment axis Y of the connector 30 form a misalignment angle α strictly between 0° and 180°. In other words, according to the general principle of the invention, the alignment axis Y of the optical connector 30 is no longer aligned with the input of the light sensor 20. In this way, it is possible to carry out a simultaneous measurement of the reference beam B3 and of the measurement beam B2 with only one measurement dimension provided that the reference beam B3 and the measurement beam B2 are spectrally directed, respectively towards a first distinct zone and a second distinct zone of the one-dimensional light sensor 20.

The term "zone" or "part" of the light sensor is understood to mean a photosite or a group of photosites of the sensor. In one particular exemplary embodiment, the optical connector 30 and the one-dimensional light sensor 20 are configured so that said first and second zones of the one-dimensional light sensor correspond, respectively, to first and second photosites or to first and second groups of photosites.

It is nevertheless interesting to approach an angle of 90° insofar as this configuration ensures a maximum shift in wavelength, which enables a more precise measurement of the atom flux J1. More precisely, the angle formed between the alignment axis and the longitudinal axis of the sensor may be from 85° to 95°. Thus, this angle remains close enough to 90° to ensure a sufficient spectral shift of the signals resulting from the attenuated and non-attenuated beams.

The curve referenced CS in FIG. 3b represents the spectral signal generated by the one-dimensional light sensor 20. It is in fact a combined spectral signal representative of a combination of a measurement spectral signal (line referenced MS) corresponding to the measurement beam B2 received and a reference spectral signal (line referenced RS) corresponding to the received reference beam B3. It can be seen that the misalignment of the two optical fibers by an angle $\alpha$ relative to the input of the light sensor 20 induces a wavelength shift ($\Delta$) on either side of the absorption wavelength of gallium. From this combined spectral signal CS, the processing unit is then able to deduce the amplitude of the atom flux J1 under evaporation in the deposition chamber 50, while taking account of the measurement drift related to the instability of light intensity of the hollow cathode lamp L1. In the example illustrated here, the processing unit works on the basis of five measurement points of the curve CS (represented by the black dots) to measure the light intensity of each beam. This arrangement thus makes it possible to overcome any measurement drift related to the instability of light intensity of the hollow cathode lamp L1. Naturally, a greater or smaller number of measurement points can be taken into account depending on the desired precision of the measurements.

It must be noted that the use of a spectrometer with a greater focal length (i.e., greater than 101 mm) would make it possible to separate the measurement and reference signals even more clearly, and thus make it easier to take the measurement drift into account. As an alternative, it is also possible to carry out a calibration phase prior to the measurement in order to discriminate between the measurement and reference signals in a reliable and robust manner. To this end, the measurement and reference signals are obtained successively by shutting off the optical paths associated with the fibers $F_2$ and $F_3$ one after the other. This calibration phase enables the processing unit to measure the shapes of the two lines, and thus to determine the relative part of the two signals through the measurement of the curve CS on two different wavelengths at least. A measurement on a larger number of points makes it possible to verify the validity of the solution found.

If this arrangement is coupled with an feedback control system (not shown), it is quite possible to control the opening and shutting of the shutter C1 associated with the flux source L1, so as to modulate the amplitude of the flux of atoms evaporating from the source, depending on the measurement result obtained by the processing unit.

It should also be noted that the light intensity ratio 70/30 of the splitter cube 40 is given purely by way of an illustrative example. The splitter cube 40 may very well be shaped to divide the incident beam B0 into a transmitted beam B1 and a reflected beam B3 with a light intensity ratio of 50/50 to 70/30 respectively.

Referring now to FIG. 4, we present a measuring device 200 according to a second particular embodiment of the invention.

Compared to the first embodiment, the measuring device 200 proposes an optical configuration making it possible to move the measurement beam back and forth in the deposition chamber. To this end, the measuring device 200 comprises an optical reflector 80 adapted to reflecting the attenuated beam B2 that is leaving the deposition chamber and sending it back again through the atom flux J1, to produce a doubly attenuated beam B2' resulting from a double transmission of the light beam through the atom flux J1. The doubly attenuated beam B2' is guided from the input of the frame 50 to the optical connector 30 by means of the optical fiber $F_2'$.

The optical fibers $F_2'$ and $F_3$ are grouped together in the multi-core optical guide $F_4$. This optical guide $F_4$ thus transports the doubly attenuated beam B2' (measurement beam) and the non-attenuated beam B3 (reference beam) to the one-dimensional light sensor 20 via the optical connector 30.

The positioning of the optical connector 30 relative to the one-dimensional light sensor 20 is identical to that shown in the first embodiment. Thus, the non-attenuated beam B2 is spectrally directed towards the first part 22 of the sensor and the doubly attenuated beam B2' is spectrally directed towards the second part 21 of the sensor.

Instead of carrying out a measurement of the matter flux as a function of the attenuated beam B2, the processing unit here carries out a measurement of the matter flux as a function of the doubly attenuated beam B2' by means of the one-dimensional light sensor. The spectral measurements obtained with this particular configuration are therefore more precise.

Naturally, the use of an optical reflector is one particular example, and it is possible to use other means fulfilling the same function of light reflection, such as an optical mirror for example.

According to one particular aspect, the measuring device 200 further comprises a light source 90, called a calibration light source, the wavelength of which is such that the radiation emitted is not absorbed by any of the atom fluxes coming from the flux sources. It is possible to envisage the use of a light-emitting diode (LED) for example, for its properties of spectral stability, with a wavelength $\lambda_{DEL}$ different from that of the light beam emitted by the hollow cathode cell 10, but detectable by the light sensor 20. Typically, a light-emitting diode of wavelength $\lambda_{DEL}$=450 nm can be used. This diode 90 is disposed in the measuring device 200 so that the calibration light beam takes the same optical path as the doubly attenuated beam B2' serving to measure the attenuated signal (from the light source 10 to the light sensor 20). Here, the diode 90 is coupled to the input optical fiber $F_0$ common to the light source 10. A continuous measurement of this calibration beam makes it possible to obtain a calibration signal for the measurement of the light intensity of the doubly attenuated beam B2' by means of an optical filter (not shown in the figure) or a beam splitter (such as the beam splitter 40) which is configured to prevent the calibration beam from the diode 90 from going into the optical fiber $F_3$ (the calibration beam must actually only go through only the measuring arm and not the reference arm). The continuous monitoring of the light intensity of this calibration beam enables the processing unit to continuously control the alignment of the optical path and take account of any drift related, for example, to the expansion of the epitaxy frame 50 by comparing the atom flux measurement signal with this reference signal. In fact, it is common for the epitaxy frame, when subjected to high temperatures, to expand, thus making the optical measurement path unstable.

The measuring device described above according to any one of its embodiments is suited to the technique of molecular beam epitaxy. It can be applied to any other technique of matter deposition or evaporation where a measurement by light absorption is possible.

The measuring device allows independent operation of the flux sources L1 and L2 for the production of a stack of different superimposed thin layers. The measuring device also allows simultaneous operation of several sources and co-deposition of several materials. As each measurement light beam is absorbed by a particular atom flux, it is therefore possible to measure the amplitude of the atom fluxes emitted simultaneously.

Since the sources L1-L2 of atom fluxes are equipped with individual shutters C1-C2, it is possible to successively or simultaneously deposit several materials while modulating the amplitude of the atom flux J1-J2 from each source L1-L2 of atoms.

Figure 5:
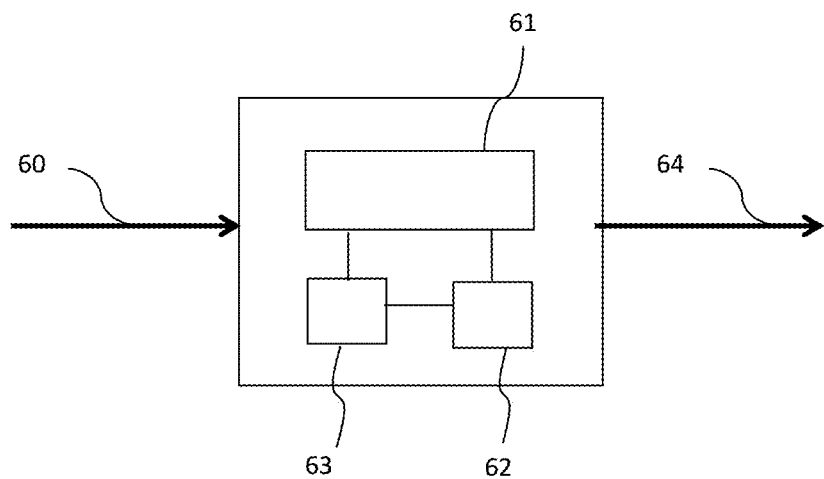
FIG. 5 shows the simplified structure of a processing unit that can be comprised in a measuring device according to one particular embodiment of the invention.

FIG. 5 shows the simplified structure of a processing unit implementing a measurement method according to one particular embodiment of the invention. Upon initialization of the method, the processing unit performs a step of measuring the matter flux as a function of the attenuated beam received by the first part of the one-dimensional light sensor and of the non-attenuated beam received by the second part of the one-dimensional light sensor.

This processing unit comprises a random-access memory 63 (for example a RAM), a processing module 61, equipped for example with a processor, and driven by a computer program stored in a read-only memory 62 (for example a ROM or hard disk drive). On initialization, the code instructions of the computer program are for example loaded into the random-access memory 63 and then executed by the processor of the processing module 61. The processing module 61 inputs a combined spectral signal 60 obtained from the attenuated beam and the non-attenuated beam detected by the one-dimensional light sensor 20 on two distinct zones thereof. The processor of the processing module 61 processes the combined spectral signal 60 and outputs a piece of real-time information 64 relating to the amplitude of the matter flux measured at an instant t, according to the instructions of the program 62.

This FIG. 5 illustrates only one particular way among several possible ways of measuring a matter flux. Indeed, the technique of the invention is carried out equally well:
- on a reprogrammable computing machine (a PC computer, a DSP processor or a microcontroller) executing a program comprising a sequence of instructions, or
- on a dedicated computing machine (for example a set of logic gates such as an FPGA or an ASIC, or any other hardware module).

Should the invention be implemented on a reprogrammable computing machine, the corresponding program (i.e., the sequence of instructions) can be stored in a detachable or non-detachable storage medium (such as for example a floppy disk, CD-ROM or DVD-ROM), this storage medium being partially or totally readable by a computer or processor.

The invention claimed is:

1. A device for measuring a matter flux, comprising:
   at least one first light source light source configured to emit a first light beam having a measurement wavelength corresponding to the absorption wavelength of an element of interest of said matter flux;
   an optical connector; and
   a light sensor configured to receive, via said optical connector:
      an attenuated beam resulting from a transmission of the first light beam through said matter flux; and
      a non-attenuated beam resulting from a transmission of the first light beam without passing through said matter flux;
   wherein the light sensor is a one-dimensional light sensor;
   and wherein the optical connector is positioned relative to the one-dimensional light sensor such that the center of the optical connector is aligned with the center of the one-dimensional light sensor, such that the non-attenuated beam is spectrally directed towards a first part of the one-dimensional light sensor and such that the attenuated beam is spectrally directed towards a second part of the one-dimensional light sensor.

2. The device according to claim 1, wherein the one-dimensional light sensor and the optical connector are defined respectively along a longitudinal axis and an alignment axis, so that the longitudinal axis of the sensor and the alignment axis of the connector form an angle strictly greater than 0° and strictly smaller than 180°.

3. The device according to claim 1, wherein the one-dimensional light sensor is positioned horizontally, and wherein the first part is a right-hand part of the one-dimensional light sensor and the second part is a left-hand part of the one-dimensional light sensor.

4. The device according to any one of the claim 1, comprising a beam splitter element configured to split the first light beam on the basis of a light intensity splitting ratio defined by a/b, with a ranging from 50 to 70 and b ranging from 50 to 30.

5. The device according to claim 1, wherein said at least one first light source is a hollow cathode lamp, said device comprising a second light source configured to emit a second spectrally stable light beam and having a wavelength different from said absorption wavelength, said second beam being emitted towards the one-dimensional light sensor in taking an optical path taken by the attenuated beam.

6. The device according to claim 1, wherein the attenuated and non-attenuated beams received by the one-dimensional light sensor take the form of a combined spectral signal representative of a combination of a measurement spectral signal corresponding to the attenuated beam received and a reference spectral signal corresponding to the non-attenuated beam received.

7. The device according to claim 1, comprising an optically reflector configured to reflect the attenuated beam towards said matter flux to produce a doubly attenuated beam resulting from a double transmission of the first light beam through said matter flux and wherein the one-dimensional light sensor is configured to receive and direct said doubly attenuated beam towards the second part of the one-dimensional light sensor.

8. A method comprising:
   measuring a matter flux by using a measuring device, comprising:
      at least one first light source light source configured to emit a first light beam having a measurement wavelength corresponding to the absorption wavelength of an element of interest of said matter flux;

an optical connector; and a light sensor configured to receive, via said optical connector:
- an attenuated beam resulting from a transmission of the first light beam through said matter flux; and
- a non-attenuated beam resulting from a transmission of the first light beam without passing through said matter flux;

wherein the light sensor is a one-dimensional light sensor;

and wherein the optical connector is positioned relative to the one-dimensional light sensor such that the center of the optical connector is aligned with the center of the one-dimensional light sensor, such that the non-attenuated beam is spectrally directed towards a first part of the one-dimensional light sensor and such that the attenuated beam is spectrally directed towards a second part of the one-dimensional light sensor;

wherein the measuring comprises measuring the matter flux as a function of the attenuated beam received by the first part of the one-dimensional light sensor and of the non-attenuated beam received by the second part of the one-dimensional light sensor.

* * * * *